METHOD OF PRODUCING TUNNEL DIODES BY DOUBLE ALLOYING
Original Filed Nov. 25, 1960
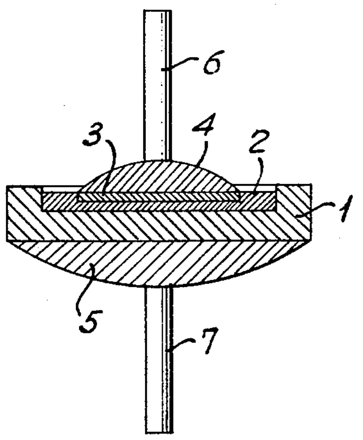
INVENTORS
TERUO HAYASHI
BY HISASHI WATANABE
Roy C. Hopgood
ATTORNEY 3,276,925
Patented Oct. 4, 1966

3,276,925

METHOD OF PRODUCING TUNNEL DIODES BY DOUBLE ALLOYING

Teruo Hayashi and Hisashi Watanabe, Tokyo, Japan, assignors to Nippon Electric Company Limited, Tokyo, Japan Continuation of application Ser. No. 71,800, Nov. 25, 1960. This application July 9, 1964, Ser. No. 382,693
Claims priority, application Japan, Dec. 12, 1959, 34/38,954
4 Claims. (Cl. 148—177)

This invention relates to a novel semiconductor element of the Esaki type, and is a continuation of our copending application Ser. No. 71,800, filed Nov. 25, 1960, now abandoned.

The semiconductor element utilizing the tunnel effect is based upon the phenomenon that electrons penetrate from one side of a P-N junction to the other as a result of the quantum mechanical tunnel effect. If the impurity concentrations of a P region and an N region forming a P-N junction of a semiconductor are increased until degeneration, the transition region width of the P-N junction is decreased greatly. Since the internal electric field produced at the junction becomes very large without the application of an external electric field, the probability of electrons penetrating, due to the Zener emission, from the valence band to the conduction band, or vice versa, is large. If an external electric field is applied to the semiconductor, its current-voltage characteristics in the forward direction will show a kind of dynatron characteristic which can be used for HF oscillation, amplification, and switching. These characteristics are associated with the tunnel diode.

The gain band width of an Esaki element is inversely proportional to the product of the negative resistance of the element and the transition capacitance which exists parallel to the negative resistance. The switching speed of the diode is also inversely proportional to its negative resistance.

Accordingly, it is necessary in the manufacture of the Esaki diode to select a semiconductor whose effective electron mass is as small as possible and to make the impurity concentration of the P domain and the N domain of the semiconductor as large as possible, for example, in the order of $10^{19}$–$10^{20}$/cm.$^3$, depending upon the semiconductor. Since the amount of impurity which can be diffused into the semiconductor is determined by its solubility and crystal preparation process, many difficulties are encountered in obtaining a suitable semiconductor single crystal.

In accordance with the invention, the impurity concentrations of the P and N domains is relatively easily formed by an alloying process, wherein a predetermined amount of impurity is added to the alloy to obtain an impurity concentration in the order of $10^{19}$–$10^{20}$/cm.$^3$.

The above mentioned and other features and objects of this invention and the manner of attaining them will become more apparent and the invention itself will be best understood by reference to the following description of an embodiment of the invention taken in conjunction with the accompanying drawing, wherein the drawing is an enlarged cross-sectional view of the novel semiconductor.

In the drawing, 1 is a part of a small piece properly cut from an N type germanium single crystal of a low specific resistance. On the surface of the crystal 1, a small piece of indium containing a particular amount of arsenic is alloyed by the conventional alloying process to form an N type region 2 with a high impurity concentration in the order of $3\times10^{19}$/cm.$^3$. The alloy on the upper part is then removed from the surface of the germanium crystal preferably by the mercury amalgamation process leaving only the parts 1 and 2. In this case, if a material, such as indium, which does not form an eutectic alloy with germanium, is selected as a main constituent of the alloy, and if the alloy is formed at a comparatively high temperature, the thickness of the recrystallized semiconductor can be easily made in the order of 50–60 microns, and the surface of the recrystallized part may be made smooth.

The germanium body with the region of high impurity concentration is alloyed again, after surface treatment, with a small amount (pellet) of indium containing a particular amount of a P type impurity, such as gallium. In the drawing, 3 is the P type region having an impurity concentration of $5\times10^{19}$/cm.$^3$. 4 represents the indium gallium alloy, employed in the last alloying process, which may be used for connecting a lead 6. Also, in this alloying process, an alloy 5, for example, of lead-antimony is alloyed at the same time to form the base electrode, to which a base lead 7 is connected.

There has now been explained an example embodying the features of this invention with N type germanium; it is apparent, however, that the same process could be utilized for a semiconductor other than germanium, for instance, silicon, intermetallic compounds, and others.

What is claimed is:

1. The method of producing a tunnel diode comprising the steps of: alloying a metal containing an impurity of a given conductivity type to a surface region of a semiconductor body of the same type conductivity to form a degenerated semiconductor region having a high impurity concentration, said metal being selected to be non-eutectic with said semiconductor body; removing a substantial portion of said alloy to expose the said high impurity concentration region; and alloying a metal containing an impurity of the opposite conductivity type to the said high impurity concentration region to form a second opposite type high impurity concentration region.

2. The method claimed in claim 1, in which the semiconductor body is N-type, the first recited impurity is a donor impurity, and the second recited impurity is an acceptor impurity.

3. The method claimed in claim 2, in which the donor impurity is arsenic and the acceptor impurity is gallium.

4. The method claimed in claim 1, in which the two recited metals are the same.

References Cited by the Examiner

UNITED STATES PATENTS

| | | | |
|---|---|---|---|
| 2,862,840 | 12/1958 | Kordalewski | 148—1.5 |
| 3,033,714 | 5/1962 | Ezaki et al. | 148—33.1 |
| 3,069,297 | 12/1962 | Beale | 148—185 |
| 3,131,096 | 4/1964 | Sommers | 148—33.1 |

DAVID L. RECK, *Primary Examiner.*

HYLAND BIZOT, *Examiner.*

R. O. DEAN, *Assistant Examiner.*